(12) United States Patent
Babcock

(10) Patent No.: US 6,682,988 B1
(45) Date of Patent: Jan. 27, 2004

(54) GROWTH OF PHOTORESIST LAYER IN PHOTOLITHOGRAPHIC PROCESS

(75) Inventor: Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/097,637

(22) Filed: Mar. 14, 2002

Related U.S. Application Data

(60) Provisional application No. 60/275,850, filed on Mar. 14, 2001.

(51) Int. Cl.$^7$ ................................................. H01L 21/76
(52) U.S. Cl. ....................................................... 438/443
(58) Field of Search ................................. 438/443, 197, 438/800; 427/503

(56) References Cited

U.S. PATENT DOCUMENTS

| | | | |
|---|---|---|---|
| 4,728,591 A | * | 3/1988 | Clark et al. ..................... 430/5 |
| 4,832,789 A | | 5/1989 | Cochran et al. |
| 5,512,131 A | | 4/1996 | Kumar et al. |
| 5,512,328 A | * | 4/1996 | Yoshimura et al. ......... 427/498 |
| 5,514,501 A | | 5/1996 | Tarlov |
| 5,618,760 A | * | 4/1997 | Soh et al. .................... 438/703 |
| 5,725,788 A | | 3/1998 | Maracas et al. |
| 5,751,018 A | | 5/1998 | Alivisatos et al. |
| 5,885,753 A | | 3/1999 | Crooks et al. |
| 5,922,214 A | | 7/1999 | Liu et al. |
| 5,981,350 A | | 11/1999 | Geusic et al. |
| 6,048,623 A | | 4/2000 | Everhart et al. |
| 6,071,812 A | | 6/2000 | Hsu et al. |
| 6,114,099 A | | 9/2000 | Liu et al. |
| 6,174,804 B1 | | 1/2001 | Hsu |
| 6,184,126 B1 | | 2/2001 | Lee et al. |
| 6,297,169 B1 | * | 10/2001 | Mangat et al. .............. 438/736 |
| 6,365,466 B1 | | 4/2002 | Krivokapic |
| 6,380,101 B1 | | 4/2002 | Breen et al. |
| 6,413,587 B1 | | 7/2002 | Hawker et al. |
| 2001/0039114 A1 | | 11/2001 | Nakamura |

FOREIGN PATENT DOCUMENTS

KR 325465 2/2002

OTHER PUBLICATIONS

Fabrication of Gold Nanostructures by Lithography with Self–Assembled Monolayers, vol. 39, No. 12, Dec. 1996, IBM Technical Disclosure Bulletin, pp. 235–238.

* cited by examiner

*Primary Examiner*—Craig Thompson
(74) *Attorney, Agent, or Firm*—Foley & Lardner

(57) ABSTRACT

A method of fabricating a feature of an integrated circuit in a layer of material includes providing a layer of photoresist having a first thickness over the layer of material; forming apertures in the layer of photoresist; growing the layer of photoresist to a second thickness greater than the first thickness; and etching the layer of material through the apertures to fabricate a feature.

20 Claims, 2 Drawing Sheets

GROWTH OF PHOTORESIST LAYER IN PHOTOLITHOGRAPHIC PROCESS

CROSS-REFERENCE TO RELATED APPLICATIONS

This application claims the benefit of U.S. Provisional Application No. 60/275,850 filed Mar. 14, 2001. This application is related to U.S. application Ser. No. 09/769,197, entitled "Dual Dlamascene Process Using Self-Assembled Monolayer", filed Jan. 24, 2001, by Krivokpic, et al., now U.S. Pat. No. 6,534,399, U.S. application Ser. No. 09/774,939, entitled "Dual Gate Fabrication Process Using Self-Assembled Molecular Laver", filed Jan. 31, 2001, by Krivokapic, now U.S. Pat. No. 6,3135,400 U.S. application Ser. No. 10/097,819, entitled "Reducing Feature Dimension Using Self-Assembled Monolayer", filed Mar. 14, 2002, by Babcock U.S. application Ser. No. 09/772,597, entitled "Dual Damascene Process Using Self-Assembled Monotayer and Spacers", filed Jan. 30, 2001, by Krivokapic.

STATEMENT REGARDING FEDERALLY SPONSORED RESEARCH OR DEVELOPMENT

Not Applicable.

FIELD OF THE INVENTION

The present specification relates generally to fabrication processes for integrated circuits (ICs). More specifically, the present specification relates to a photolithographic process for fabricating ICs.

BACKGROUND OF THE INVENTION

The semiconductor industry has a need to manufacture integrated circuits (ICs) with higher and higher densities of devices on a smaller chip area to achieve greater functionality and to reduce manuacturing costs. This desire for large-scale integration has led to a continued shrinking of the circuit dimensions and features of the devices.

The ability to reduce the sizes of structures, such as gates in field effect transistors (FETs), is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

One challenge facing lithographic technology is fabricating features having a critical dimension (CD) below 100 nm. All steps of the photolithographic techniques currently employed must be improved to achieve the further reduction in feature size. One step which must be improved is the patterning of photoresist (e.g., exposure and development) on the substrate.

In a conventional technique, a photoresist layer on a layer of material is exposed to light or radiation through a binary mask. The photoresist layer may be either a positive or a negative photoresist. The light causes a photochemical reaction in the photoresist. The photoresist is removable with a developer solution at the portions of the photoresist that are exposed through the mask. The photoresist is developed to clear away these portions, whereby a photoresist pattern of features remains on the layer of material. An integrated circuit feature, such as a gate, via, or interconnect, is then etched into the layer of material, and the remaining photoresist is removed.

The linewidth of the integrated circuit feature is limited using the conventional process by, for example, aberrations, focus, and proximity effects in the use of light. Using a 248 nm wavelength light source, the minimum printed feature linewidth is between 300 and 150 nm, using conventional techniques.

Photoresist is typically applied with a thickness of several thousands of Angstroms, in order to adequately resist the etchant during the etching step. However, a very thick photoresist layer can reduce the depth of focus or resolution of the photolithograhpic process. Thus, ultra-thin resists have been implemented. However, corner rounding problems and insufficient etch protection are associated with using thinner photoresists. The result is poor resolution.

Accordingly, there is a need for a method of reducing the linewidth of features fabricated in an integrated circuit. Further, there is a need for photoresist layer which has the benefits of a thin photoresist layer during exposure and the advantages of a thick photoresist layer during etching. Further still, there is a need for such a method which is simple and cost-effective to implement. The teachings hereinbelow extend to those embodiments which fall within the scope of the appended claims, regardless of whether they accomplish one or more of the above-mentioned needs.

SUMMARY OF THE INVENTION

According to an exemplary embodiment, a method of fabricating a feature of an integrated circuit in a layer of material includes providing a layer of photoresist having a first thickness over the layer of material. The method further includes forming apertures in the layer of photoresist and growing the layer of photoresist to a second thickness greater than the first thickness. The method further includes etching the layer of material through the apertures to fabricate a feature.

According to another exemplary embodiment, a method of fabricating a feature of an integrated circuit in a layer of material includes providing a self-assembled molecular structure having a first thickness over the layer of material. The method further includes forming apertures in the self-assembled molecular structure and growing the self-assembled molecular structure to a second thickness greater than the first thickness. The method further includes etching the layer of material through the apertures to fabricate a feature.

According to yet another exemplary embodiment, an integrated circuit has a feature, such as a transistor. The feature is fabricated by the process of providing a first layer of photoresist over the layer of material and forming apertures in the first layer of photoresist. The method further includes exposing the first layer of photoresist to a solution containing molecules capable of forming a self-assembled monolayer. The self-assembled molecule forms a second layer of photoresist over the first layer of photoresist. The process further includes etching the layer of material through the apertures to fabricate a feature.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 1:
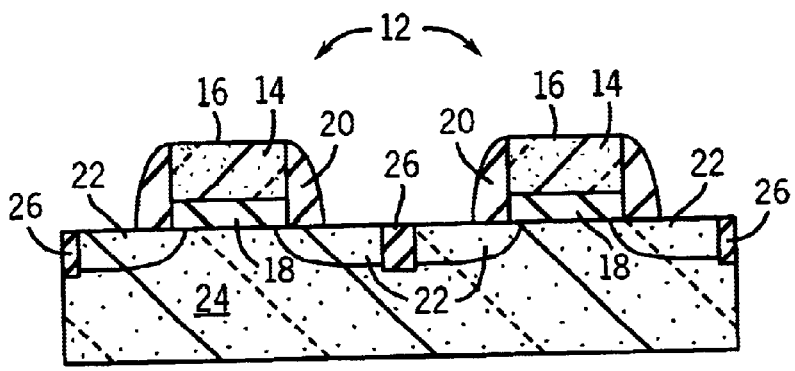
FIG. 1 is a schematic cross-sectional view of a portion of an integrated circuit having devices fabricated thereon, according to an exemplary embodiment.

Referring first to FIG. 1, a portion 10 of an integrated circuit is illustrated according to an exemplary embodiment. Portion 10 includes a plurality of devices 12, such as, transistors, capacitors, resistors, etc., which may have one or more features, such as, a gate, a contact, an etched edge, an aperture, or other feature. The system and method of this exemplary embodiment will be described with reference to fabrication of transistors, and, more specifically, fabrication of gate conductors 14 of transistors. Devices 12 may be any type of transistors, such as, complimentary metal oxide semiconductor (CMOS) field-effect transistors (FETs). The integrated circuit may be a very large scale integration (VLSI) integrated circuit, having one million or more devices.

Devices 12 include gate stacks 16 having gate conductors 14, oxide or gate insulators 18, and sidewall spacers 20. Gate conductors 14 may be fabricated from any gate conductor material, such as, aluminum, doped silicon, polysilicon, amorphous silicon, etc. Gate conductors 14 are fabricated according to the exemplary system and method disclosed herein and may have a gate length of between 35 and 100 nm, or less than 35 nm. The exemplary embodiments disclosed herein allow reduction of the gate length or other dimension of gate conductors 14 from a conventional size of 300–150 nm, to a smaller size of 100 nm or less, Gate insulators 18 may include an oxide, such as, $SiO_2$, or other insulative material. Sidewall spacers 20 include a nitride material in this exemplary embodiment, but may alternatively include any type of barrier or insulative material.

Devices 12 further include source and drain regions 22, which are doped regions of a substrate 24. Substrate 24 is a semiconductor substrate in this exemplary embodiment, including silicon, gallium arsenide, or germanium, but may alternatively be any type of substrate, such as, glass, quartz, ceramic, etc. Source and drain regions 22 include N- or P-type dopants. Devices 12 may further include isolation structures 26, such as, shallow trench isolation structures, to provide electrical isolation among devices 12 and between devices 12 and neighboring devices.

Figure 2:
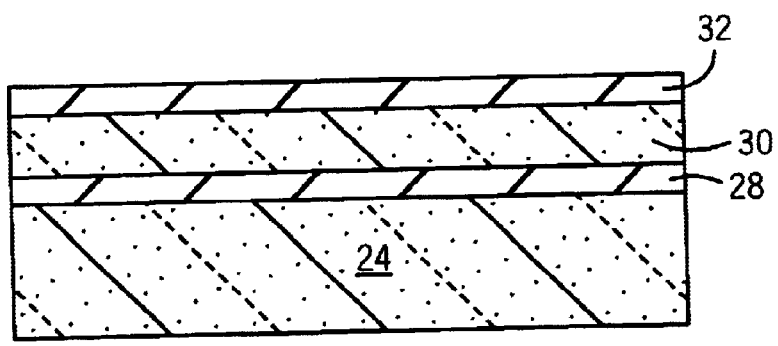
FIG. 2 is a schematic cross-sectional view of the integrated circuit of FIG. 1, showing a photoresist providing step.

Referring now to FIGS. 2–6, a system and method for fabricating devices 12 will be described, according to an exemplary embodiment. In FIG. 2, an insulative layer 28 is applied over substrate 24 by a conventional deposition process, such as, chemical vapor deposition (CVD), physical vapor deposition (PVD), etc. Insulative layer 28 may include an oxide, or other insulative material, and is provided with a thickness of between 500 and 4000 Angstroms. A gate conductor layer 30 is provided over insulative layer 28 by a conventional deposition process. Gate conductor layer has a thickness of between 500 and 2000 Angstroms in this exemplary embodiment. Any suitable material for a gate conductor may be used, including metal or semiconductive materials (e.g., doped polysilicon).

According to one advantageous aspect of this exemplary embodiment, a thin photoresist layer 32 is applied over gate conductive layer 30, The composition of thin photoresist layer 32 includes any material that can be grown or built upon to an increased thickness in a later processing step. For example, thin photoresist layer 32 may include a self-assembled monolayer or a multllayer, having a self-assembled molecular structure. Exemplary self-assembled molecular structures include a Langmuir monolayer, a Langmuir-Blodgett film, a Gibbs monolayer, a thiol, etc. Self-assembled molecular structures are molecular assemblies that are formed spontaneously by the immersion of an appropriate substrata into a solution of an active surfactant in an organic solvent. Self-assembled layers typically include an anchoring group which adsorbs to a specific substrate, a spacer group, such as, an alkyl chain, and a surface group which has a desired property. Exemplary substrates suitable for use with self-assembled molecular layers include hydroxylated surfaces (e.g., $SiO_2$, $Al_2O_3$, etc.), silver, gold, copper, platinum, aluminum oxide, etc.

One exemplary molecular structure suitable for this embodiment is a photosensitive polyimide which can be exposed with a KrF excimer laser at 248 nm wavelength of ultraviolet (UV) light. The photosensitive polyimide can be deposited with a Langmuir-Blodgett (LB) technique. Another exemplary molecular structure which can be deposited with a Langmuir-Blodgett technique is a polymethylmethacrylate (PMMA).

Another exemplary molecular structure is an alkanethiolate which can be,deposited as a self-assembled molecular layer.

Another exemplary molecular structure is an octadecyl fumeric acid that can be polymerized by exposure to UV light.

Thin photoresist layer 32 is fabricated in this exemplary embodiment by exposing gate conductor layer 30 to a solution containing a self-assembled molecular structure for a period of time. The period of time will vary based upon the desired thickness of layer 32, and is typically on the order of between 20 seconds and 120 seconds. Thin photoresist layer 32 is grown in this step to a thickness of preferably between 100 and 1000 Angstroms, or less than 7,000 Angstroms. Other thicknesses may be used, depending upon the desired depth of focus or resolution of the exposure step described below. Thin photoresist layer 32 may be a monolayer or a multilayer.

Figure 3:
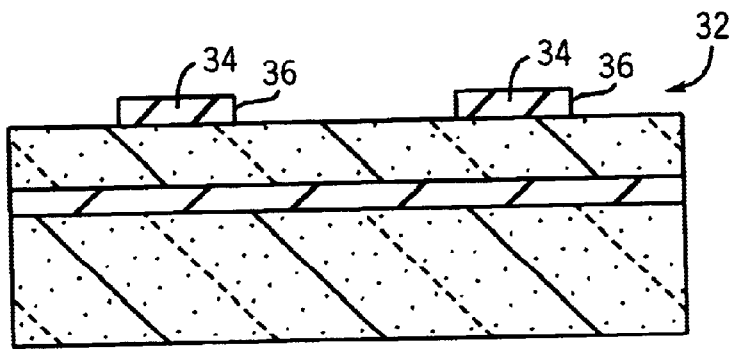
FIG. 3 is a schematic cross-sectional view of the integrated circuit of FIG. 1, showing an aperture forming step.

Referring now to FIG. 3, thin photoresist layer 32 is exposed to radiation, such as light or electron-beam radiation, to pattern thin photoresist layer 32. In this exemplary embodiment, electron-beam lithography is used. For example, an AEBLE-150 direct-write system, manufactured by Etec Systems, Inc., Hayward, Calif., may be used. Alternatively, a synchrotron radiation exposure can be used. The exposure step may be provided through a mask, such as a binary mask, an alternating phase shift mask, an attenuating phase shift mask, etc. The exposure step forms features 34 and apertures 36 in photoresist layer 32. Various patterns may be provided, including interconnect patterns, transistor gate patterns, contact vias or holes, or other patterns. Photoresist features 34 are provided with a feature dimension (e.g., length, width, etc.) smaller than that available using conventional techniques, due to the thin nature of layer 32. For example, features 34 may have a length or width of less than 100 nm or as low as 35 nm. Features 34 may further be reduced in size by plasma trimming or another trimming process.

The exposure step may alternatively use an excimer laser having a wavelength of 248 nm, 193 nm, 157 nm, or another wavelength. The exposure step reacts with photoresist layer 32, thereby making portions of photoresist layer 32 soluble in a developing step. In the developing step, a developer solution is provided to remove portions of photoresist layer 32, thereby forming apertures 36 and features 34. The developer solution can be water in the case of an alkanethiolate self-assembled monolayer film. In the case of a PMMA LB film, a solution of 2 parts methyl isobutyl ketone and 1 part isopropyl alcohol at 23 degrees Celsuis can be used. In the case of a polyimide LB film, a solution of N-dimethylacetamide and ethyl alcohol in the ratios of from 1:1.5 to 1:0.8 can be used.

Figure 4:
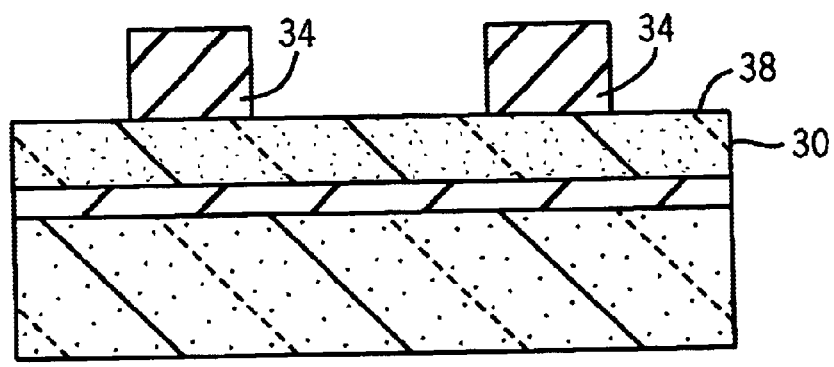
FIG. 4 is a schematic cross-sectional view of the integrated circuit of FIG. 1, showing a photoresist layer growing step.

Referring now to FIG. 4, a photoresist growing step is illustrated. Photoresist features 34 are grown in this exemplary embodiment by providing additional photoresist material to features 34. One exemplary method is to use a Langmuir-Blodgett film as a seed layer to grow a thicker, more etch-resistant layer having the desired pattern represented by features 34. Photoresist features 34 may be grown to a thickness of between 500 and 2500 Angstroms, or at least 500 Angstroms, to provide a more etch-resistant layer.

According to one alternative embodiment, gate conductor layer 30 may be used as a seed layer for growing an etch-resistant hard mask around features 34. In this alternative example, the hard mask may be grown on a top surface 38 of gate conductor layer 30 to a suitable etch-resistant height, such as, between 400 and 1300 Angstroms, or at least 400 Angstroms. Features 34 are then removed with a photoresist removal process, such as a lift-off, or other process, leaving apertures in the hard mask formed on top surface 38. The pattern provided by the hard mask will be inverted relative to that of the first exemplary embodiment, and the pattern to be fabricated in conductor layer 30 should be accordingly inverted with respect to the pattern of the prior embodiment.

Figure 5:
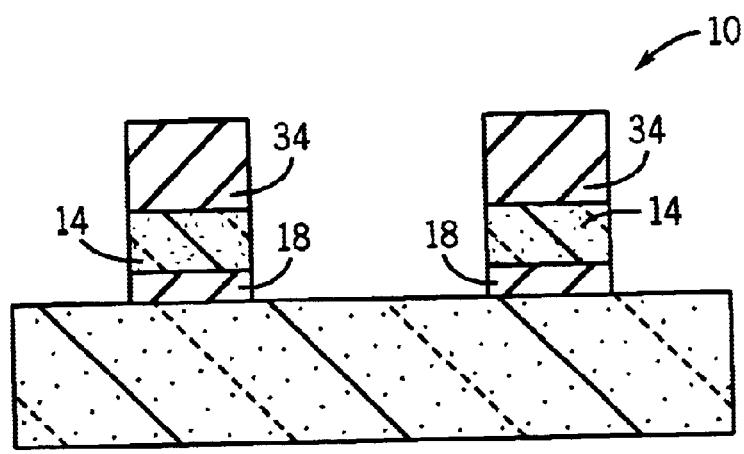
FIG. 5 is a schematic cross-sectional view of the integrated circuit of FIG. 1, showing an etching step.

Referring now to FIG. 5, an etching step is illustrated. An etchant, such as a wet or dry etchant, is provided to portion 10, which etches away portions of layer 30 and/or layer 28 at portions of those layers which are not masked by photoresist features 34. The etchant may be provided for between 10 and 90 seconds, depending on etch rate, and conventional etching steps may be utilized. Photoresist features 34 have a suitable etch-resistant thickness. Gate conductors 14 and gate insulators 18 are etched into layers 28 and 30 by the etching step. Gate conductors 14 and gate insulators 18 may have a gate length of less than 35 nm.

Figure 6:
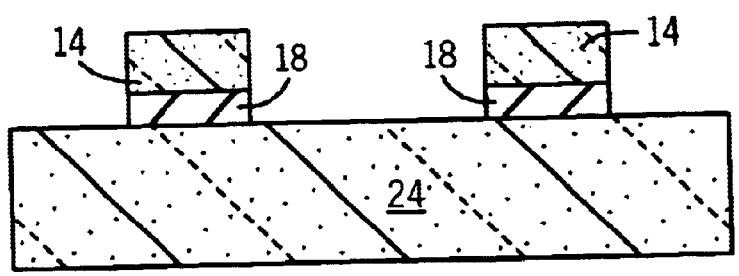
FIG. 6 is a schematic cross-sectional view of the integrated circuit of FIG. 1, showing a photoresist removal step.

Referring now to FIG. 6, photoresist features 34 are removed in a conventional process, leaving gate conductors 14 and gate insulators 18 on substrate 24.

Referring now to FIG. 1, conventional transistor fabrication steps are utilized to fabricate sidewall spacers 20, doped regions 22, and isolation structures 26. Additional steps may fabricate local interconnects, and electrical contacts between devices 12 and other devices on the integrated circuit.

While the exemplary embodiments illustrated in the FIGS. and described above are presently preferred, it should be understood that these embodiments are offered by way of example only. For example, while self-assembled molecular layers are utilized to grow photoresist features 34 in this exemplary embodiment, other techniques for growing photoresist features 34 to a greater thickness may be utilized. Further, while the exemplary embodiments are disclosed with reference to fabricating a transistor, any feature of an IC may be fabricated using these teachings process with appropriate modifications to such teachings, Accordingly, the present invention is not limited to a particular embodiment, but extends to various modifications that nevertheless fall within the scope of the appended claims.

What is claimed is:

1. A method of fabricating a feature of an integrated circuit in a layer of material, comprising:
   providing a layer of photoresist including a self-assembled molecular structure and having a first thickness over the layer of material;
   forming apertures in the layer of photoresist;
   growing the layer of photoresist to a second thickness greater than the first thickness; and
   etching the layer of material through the apertures to fabricate a feature.

2. The method of claim 1, wherein the layer of photoresist includes a self-assembled monolayer or multilayer film.

3. The method of claim 2, wherein the self-assembled assembled monolayer or multilayer film includes a Langmuir-Blodgett film.

4. The method of claim 3, wherein the step of forming apertures includes exposing the Langmuir-Blodgett film to an electron beam.

5. The method of claim 3, wherein the step of forming apertures includes exposing the Langmuir-Blodgett film to an excimer laser.

6. The method of claim 1, wherein the first thickness Is less than 100 nm.

7. The method of claim 6, wherein the second thickness is at least 100 nm.

8. The method of claim 1, wherein the step of forming apertures includes exposing the layer of photoresist to a source of radiation and developing portions of the photoresist in a developer solution to form the apertures.

9. The method of claim 1, wherein the layer of material includes a gate conductor material and the feature is a gate for a transistor.

10. A method of fabricating a feature of an integrated circuit in a layer of material, comprising:
    providing a photoresist layer including a self-assembled molecular structure, the photoresist layer having a first thickness over the layer of material;
    forming apertures in the self-assembled molecular structure;
    growing the photoresist layer using the self-assembled molecular structure to a second thickness greater then the first thickness; and
    etching the layer of material through the apertures to fabricate a feature.

11. The method of claim 10, wherein the self-assembled molecular structure includes a Langmuir-Blodgett film.

12. The method of claim 11, wherein the step of forming apertures includes exposing the Langmuir-Blodgett film to an electron beam.

13. The method of claim 11, wherein the step of forming apertures Includes exposing the Langmuir-Blodgett film to an excimer laser.

14. The method of claim 10, wherein the first thickness is less than 40 nm.

15. The method of claim 14, wherein the second thickness is at least 100 nm.

16. The method of claim 10, wherein the step of forming apertures includes exposing the self-assembled molecular structure to a source of radiation and developing portions of the self-assembled molecular structure in a developer solution to form the apertures.

17. A process of fabricating an integrated circuit having a feature, comprising:

provide a layer of photoresist including a self-assembled molecular structure and having a first thickness over the layer of material;

forming apertures in the layer of the photoresist;

exposing the layer of photoresist to a solution containing molecules capable of forming a self-assembled monolayer, wherein the layer of photoresist grows to a thickness greater than the first thickness due to the self-assembled monolayer; and etching the layer of material through the apertures to fabricate a feature.

18. The processes of claim 17, wherein the step of exposing Includes using a Langmuir-Blodgett film deposition method to deposit one or more monolayers of a Langmuir-Blodgett film.

19. The process of claim 17, wherein the layer of photoresist has a self-assembled molecular film.

20. The process of claim 17, wherein the layer of photoresist has a thickness of less than 100 nm.

* * * * *

UNITED STATES PATENT AND TRADEMARK OFFICE
CERTIFICATE OF CORRECTION

PATENT NO. : 6,682,988 B1
DATED : January 27, 2004
INVENTOR(S) : Carl P. Babcock It is certified that error appears in the above-identified patent and that said Letters Patent is hereby corrected as shown below:

Column 6,
Line 25, delete extra word "assembled".
Line 34, change "Is" to -- is --.
Line 53, change "then" to -- than --.
Line 63, change "Includes" to -- includes --.

Column 8,
Line 6, change "Includes" to -- includes --.

Signed and Sealed this

Eighth Day of June, 2004

JON W. DUDAS
*Acting Director of the United States Patent and Trademark Office*